United States Patent [19]

Lehmann

[11] 4,313,195

[45] Jan. 26, 1982

[54] REDUCED SAMPLE RATE DATA ACQUISITION SYSTEM

[75] Inventor: Joseph L. Lehmann, Sarasota, Fla.

[73] Assignee: Sangamo Weston, Inc., Norcross, Ga.

[21] Appl. No.: 32,621

[22] Filed: Apr. 23, 1979

[51] Int. Cl.³ ............................................. H04J 3/04
[52] U.S. Cl. .................... 370/84; 370/113; 364/724
[58] Field of Search ............. 179/15.55 R; 370/84, 370/113; 364/724

[56] References Cited

U.S. PATENT DOCUMENTS

| | | | |
|---|---|---|---|
| 3,819,864 | 6/1974 | Carroll | 370/113 |
| 3,887,873 | 6/1975 | Duncan | 370/113 |
| 3,930,147 | 12/1975 | Bellanger | 364/724 |
| 3,988,607 | 10/1976 | Eggermont | 364/724 |
| 4,021,616 | 5/1977 | Betts | 364/724 |
| 4,031,506 | 6/1977 | Siems | 370/113 |
| 4,099,245 | 7/1978 | Maysonnet | 370/113 |
| 4,101,964 | 7/1978 | Betts | 364/724 |
| 4,117,541 | 9/1978 | Ali | 364/724 |
| 4,121,055 | 10/1978 | Doherty | 179/15 A |
| 4,143,242 | 3/1979 | Horiki | 370/84 |

Primary Examiner—David L. Stewart
Attorney, Agent, or Firm—Joseph J. Kaliko; Mikio Ishimaru; Dale Gaudier

[57] ABSTRACT

A data acquisition system having plural input channels sampled at a first rate by a time division multiplexer applies the samples to a finite impulse response (FIR) discrete filter which generates output samples at a slower rate.

The filter forms a set of summations $$\sum_{i=0}^{k-1} Z(t_{pR+i}) \cdot H_{K-i}$$

where $Z(t_i)$ is an input sample at a time $t_i$, $H_i$ is the $i^{th}$ value of the filter impulse response, p is a sequence of successive integers, 0, 1, 2, . . . , each of which corresponds to one output sample, K is the length of filter impulse response (number of samples for each output) and R is the ratio of the initial input sample rate to the desired sample rate. A 3 to 1 reduction ratio is achieved with $K=31$, with the filter forming 11 different overlapping summations, so that after start-up one filtered output sample is outputted after each successive group of 3 inputs. Coefficients and the summations are stored in ROMs and RAMs, and coefficient and memory locations are indexed by counters having a modulo equal to the next integer greater than K/R.

19 Claims, 15 Drawing Figures

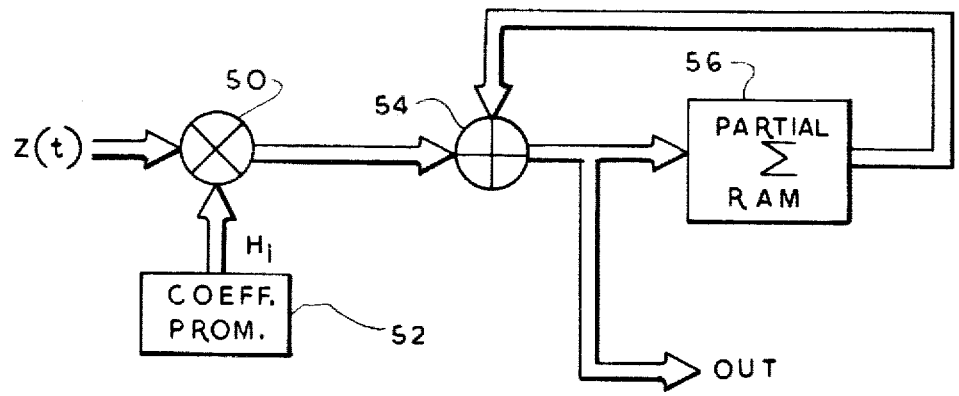
FIG. 6A
$$\sum_{3=D}^{K-1} z(T_i) \cdot H_{R-i}$$
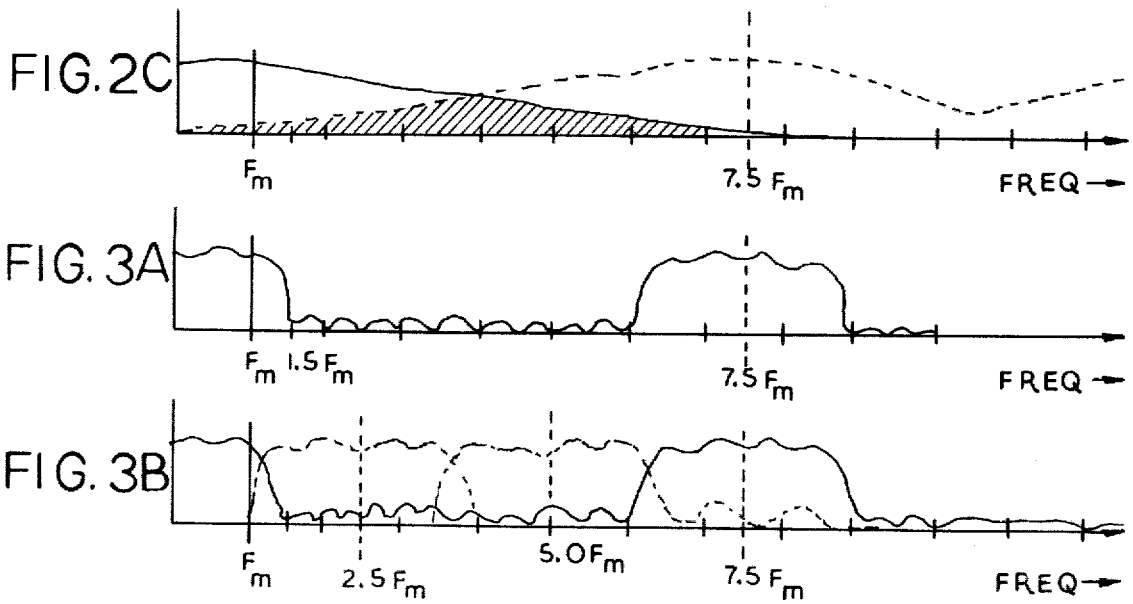

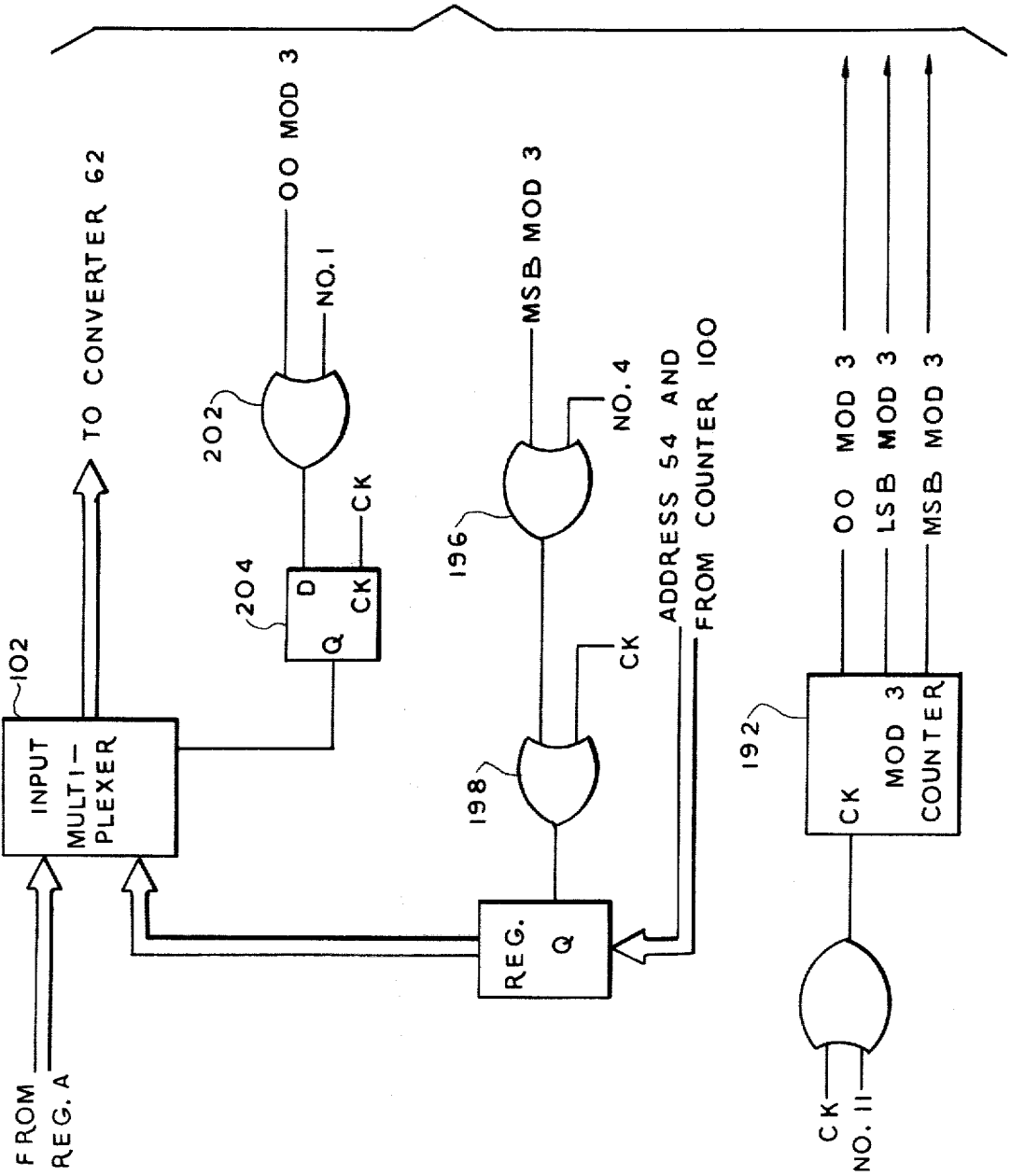

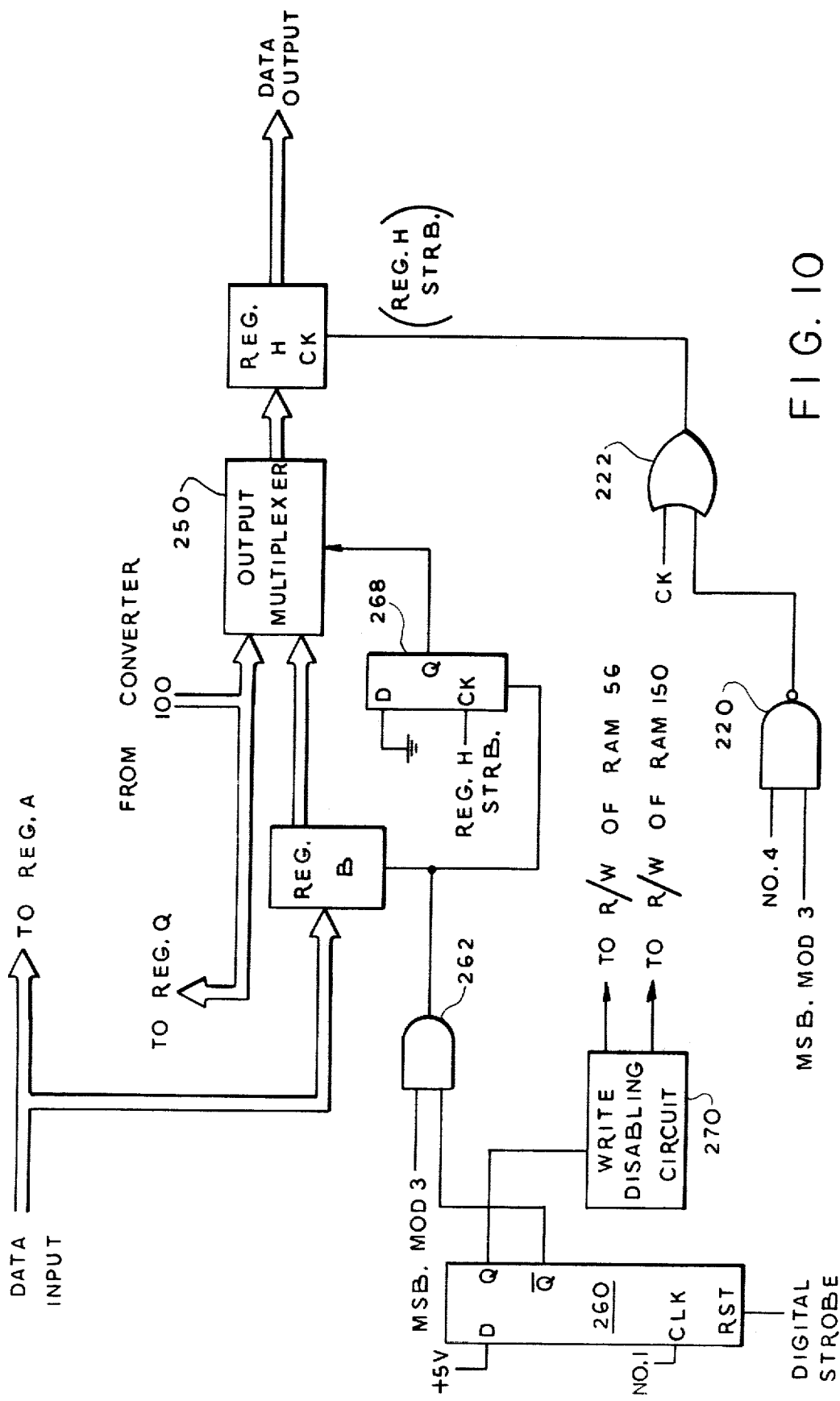

REDUCED SAMPLE RATE DATA ACQUISITION SYSTEM

BACKGROUND OF THE INVENTION

The present invention relates generally to data acquisition devices and sample rate reduction equipment and methods therefor.

Modern scientific analysis of complex events frequently requires the acquisition of voluminous data. Various sophisticated systems are used to gather data about a device for phenomenon being investigated and to refine the data so that it is comprehensible to an engineer or scientist. Generally, a large number of parameters must be monitored, and frequently the density of information is extremely high. For example, to test a reactor core cooling system, the dynamic stress on each of the reactor rods must be monitored, as well as all other paremeters which vary during reactor operation. Accordingly, a system may be required to receive and process two hundred or more data channels. The overall system would include means for acquiring the raw data at each channel and means for processing the data.

The acquisition, processing and recording of the entire continuum of data occurring over many channels is frequently impossible due to the extremely high information volume and/or density. To alleviate this problem, samples of data in each channel are taken, and it is only the samples which are recorded and processed. However, a substantial quantity of data still remains. So, because in a data gathering and/or evaluation system there generally exists a maximum frequency of interest which is known beforehand, the art has sought to further alleviate the problem by ignoring samples for data above that maximum frequency of interest. In accordance with the Nyquist sampling theory, to sample adequately any continuum of data, at least two samples are required for each cycle at the maximum frequency of the data. Ideally then, a system which gathers data for subsequent processing, i.e. a data acquisition system, could sample the continuous data at twice that known maximum frequency of interest to reduce to an absolute minimum the data which are needed to describe the input continuum adequately.

However, in practice, great expense is required to approach the ideal lower limit. The signal conditioner unit for each data channel typically includes a pre-sample filter (sometimes called an anti-aliasing filter), but since two hundred or more channels may be required, filter matching and expense becomes a problem. Therefore, data acquisition systems in current use compromise expense with performance and typically include three- to five-pole filters. It has been found necessary, though, when using such filters, to increase the sampling rate typically to five times the maximum frequency of interest in order to obtain samples to describe the data without excess alias error. This in turn regenerates problems where high density data acquisition is required: the greater the number of samples, the greater the burden on the processing and recording equipment. Taking samples at five times the maximum frequency of interest yields 2.5 times as much data as are theoretically necessary to describe the phenomenon.

It is therefore the primary object of the present invention to provide a data acquisition system which provides fewer samples than are typically taken to describe adequately a phenomenon under investigation without sacrificing sample accuracy and at a reasonable cost.

SUMMARY OF THE INVENTION

To improve the performance of data acquisition systems, the present invention in one of its salient aspects couples data input channels to the recording and/or processing apparatus through a high performance filter having a fast roll-off at the highest frequency of interest. Preferably, a multiplexed plurality of input channels is inputted to a dedicated high speed processor which operates as a discrete low pass filter with a cutoff frequency of $F_{max}$ and a transition band, i.e. from the maximum frequency of pass band to the minimum frequency of reject band, no greater than $(D-2) F_{max}$ where $D \cdot F_{max}$ equals the output sample rate. Further, according to another important aspect of the invention, the filter operates on a plurality of input samples to generate a smaller number of output samples.

Illustratively, thirty one successive input samples $Z(t_i)$ from a given channel are processed to generate one output for that channel. The first input $Z(t_0)$ is multiplied by a corresponding impulse response coefficient $H_{31}$ and the product $Z(t_0) \cdot H_{31}$ is stored in a memory device as a partial accumulation. The next input $Z(t_1)$ for that same channel is multiplied by $H_{30}$ and the product $Z(t_1) \cdot H_{30}$ is added to $Z(t_0) \cdot H_{31}$ to update the partial accumulation. Processing continues until thirty one samples form a complete accumulation which can be expressed as $$\sum_{0}^{30} Z(t_i) \cdot H_{31-i}$$

That accumulation is then scaled to adjust for unity gain and outputted.

So that a rate reduction ratio (R) can be achieved, a new accumulation begins for the same channel using input samples which are (R) samples subsequent to the first group, i.e. for a three to one reduction ratio the accumulation $\Sigma Z(t_{i+3}) \cdot H_{31-i}$ is formed. Successive accumulations each (R) samples subsequent to the proceding accumulation are formed, i.e.

$$\Sigma Z(t_{6+i}) \cdot H_{31-i}, \Sigma Z(t_{9+i}) \cdot H_{31-i},$$

etc. In general, a set of summations described by $$\sum_{i=0}^{k-1} Z(t_{pR+i}) \cdot H_{K-i}$$

are formed, where K is the number of input samples per output and p is a sequence of successive integers, 0, 1, 2, 3, 4, ... each of which corresponds to one output sample.

The result of this improvement can be understood by referring to a mathematical model. A continuously variable function in the time domain can be described by periodic sampling thereof: a function representing a sequence of evenly spaced unit impulses $\delta(t)$ is multiplied with the continuous input data $F(t)$ to yield a composite function which is a sequence of sample pulses weighted with the input data. The Fourier transform may be applied to convert this time domain model to a frequency domain model. Since the Fourier transform of the evenly spaced sampling unit impulses $\delta(n\Delta t)$ is evenly spaced unit impulses $\delta(n\Delta \omega)$ in the frequency domain, the resulting convolution yields the Fourier transform of the sampled continuously variable data as the sum for all n of the Fourier transform of the original continuously variable data as a function of $(n\Delta\omega + \omega)$. When the Fourier transform of the original continuously variable function is nonzero for $\omega > \Delta\omega/2$, an overlapping of functions occurs in the Fourier transform of the sampled data. This overlap causes inaccurate data which is called "alias error," which will be propagated in the system to yield a less accurate analysis. However, by means of the present invention, the data band overlap is reduced. Alias error is thereby reduced to acceptable proportions despite the decreased and more desirable sampling rate.

As a consequence, fewer than five samples per cycle of maximum frequency of interest need be recorded to describe the data adequately. The illustrated data acquisition system has an initial sampling rate of 7.5 $F_{max}$, but samples are combined in the filter so that 2.5 $F_{max}$ samples are outputted. It will be appreciated by those skilled in the art that by means of this improvement, the ideal sampling rate of 2 $F_{max}$ is approached, and the workload and overhead required for processing and recording equipment is substantially reduced.

BRIEF DESCRIPTION OF THE DRAWINGS

Further features and advantages of the invention will become more apparent from the following detailed description where reference is made to the accompanying drawings wherein:

FIGS. 2A, 2B and 2C are spectrum diagrams useful in explaining prior art systems and the present invention;

FIGS. 3A and 3B are spectrum diagrams pertaining to the illustrated filter according to the present invention;

FIGS. 6A and 6B are simplified diagrams of the computing hardware of the illustrated digital filter;

FIG. 8 is a block diagram of components relating to scaling the filtered samples in the illustrated filter;

FIG. 10 is an illustrative block diagram of the output circuitry of the illustrated filter.

DESCRIPTION OF A PREFERRED EMBODIMENT

Figure 1:
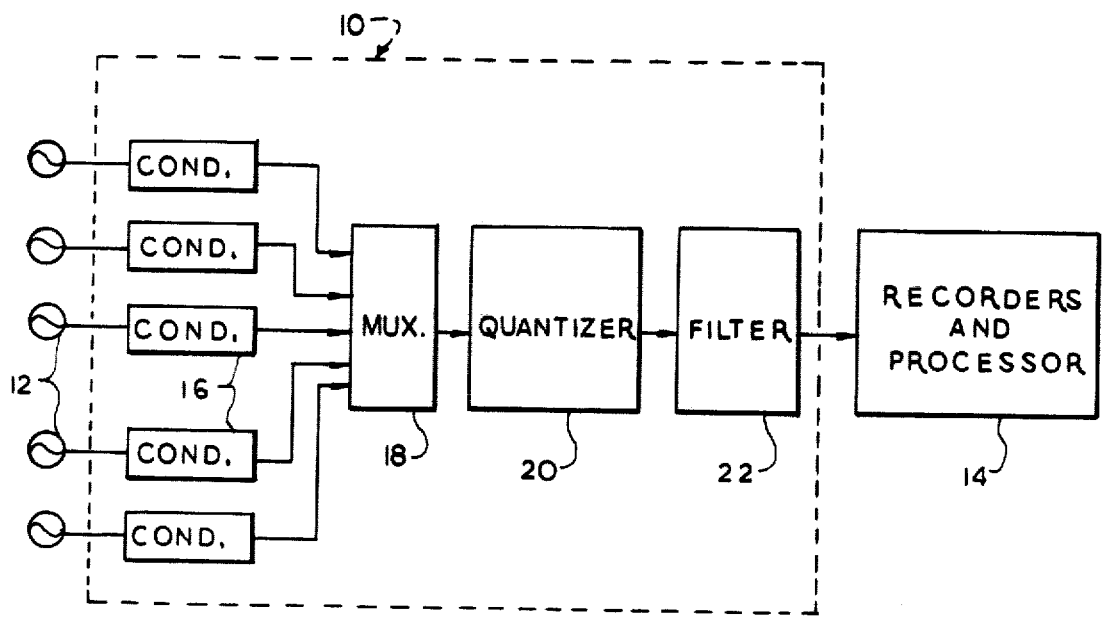
FIG. 1 is a block diagram of a data acquisition system according to the preferred embodiment of the present invention.

FIG. 1 shows a data acquisition system 10 according to the preferred embodiment of the present invention which provides data from a plurality of N channels 12 to other equipment, such as recorders and a processor 14. Inputs 12 typically comprise transducers placed on a mechanical test article. Each transducer 12 is coupled to a respective signal conditioning amplifier 16 which functions to improve the signals generated by the transducer 12. Typically, conditioner 16 includes a differential input stage amplifier which rejects common mode voltage and outputs single ended signal voltage. Further, conditioner 16 also includes a pre-sample low pass filter which is described further in referring to FIGS. 2A, 2B and 2C. The outputs of signal conditioners 16 are applied to a time division multiplexer 18 which is coupled to (or includes) a quantizer 20. Typically multiplexer 18 is controlled by a computer (not shown) which indicates the sample ordering and timing, etc. Quantizer 20 assigns a discrete value to each multiplexed input signal, and in prior art systems it provided the output of the data acquisition system and thus could be coupled directly to a recorder and/or processor for subsequent use of the information. The output of quantizer 20 is a sequence of discrete value samples describing the data generated by transducers 12. According to one aspect of the present invention, however, quantizer 20 is coupled to recorders and processor 14 via a filter 22 which, according to a second aspect of the present invention, reduces the number of output samples while maintaining accuracy.

Figure 2A:
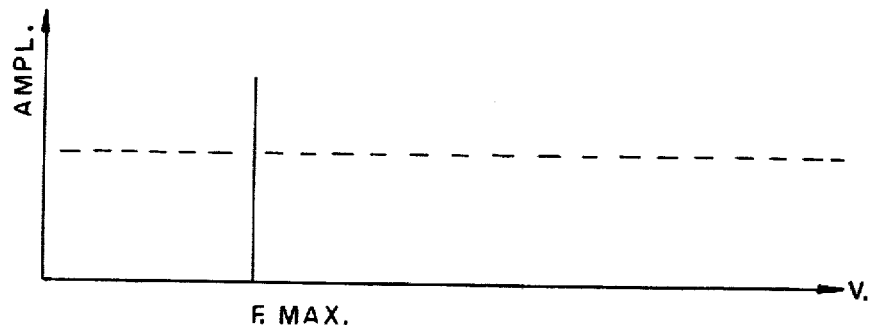
Figure 2B:
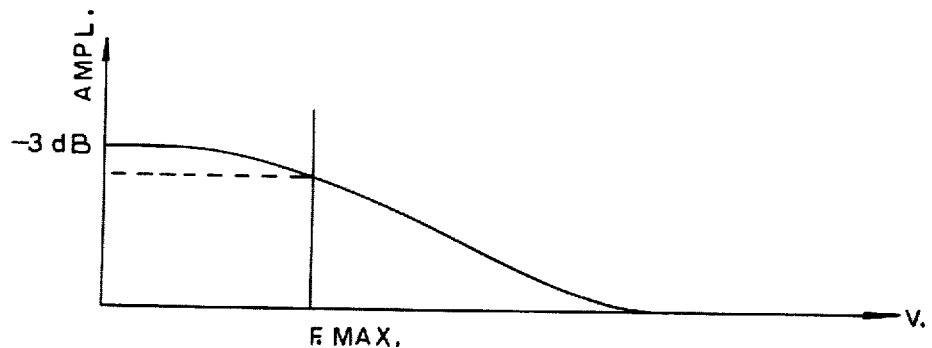

Referring to FIG. 2A, the frequency of signals which might be applied to any of transducers 12 illustratively is broadband white, that is, it may extend theoretically over the entire spectrum. Generally, however, a maximum frequency of interest $F_{max}$ as shown in FIG. 2A exists with respect to any system being monitored or tested. Accordingly, the low pass filters included in signal conditioners 16 roll off at approximately $F_{max}$. Typically, the filters used are three- or five-pole Bessel characteristic linear phase filters with a $-3$ dB point at $F_{max}$ whose responses are illustrated in FIG. 2B.

One excellent multiplexer is the EMR 429 programmable multiplexer-encoder manufactured by the EMR Data Systems Division of Sangamo Weston, Inc. in Sarasota, Florida. The EMR 429 comprises multiplexer 18 and quantizer 20, and in its multiplexing function can sample at rates as high as one million samples per second and receive up to 512 analog channel inputs.

Typically, multiplexer 18 is set to take samples at 5 $F_{max}$, but with the use of the present invention it takes input samples Z(t) at 7.5 $F_{max}$. FIG. 2C illustrates the spectrum after sampling, and as shown therein, the baseband lobe is centered at DC while translated lobes are centered at multiples of the sampling rate, that is, at 7.5 $F_{max}$, 15 $F_{max}$, etc. Each curve of FIG. 2C is a part of the convolution integral which is generated by one spectral line of the sample pulses, and the total spectrum is the summation of the curves there shown. The shaded area on FIG. 2C, i.e. the intersection of the curves therein, when summed with the individual curves causes a distorted signal by adding what is called "alias error." As mentioned earlier, frequencies above $F_{max}$ are ignored, so the alias error of consequence is the shaded portion to the left of $F_{max}$. The alias error portion can be made smaller by increasing the sample rate. Indeed, the typical sample rate is 5 $F_{max}$ rather than 7.5 $F_{max}$, and the typical alias error is larger than illustrated in FIG. 2C. However, increased sampling rate is not an acceptable solution to solving the alias error problem due to the higher overhead required to handle the increased data. In fact, without the present invention, the increased sampling rate of 7.5 $F_{max}$ as shown in FIG. 2C would significantly increase system overhead.

It can be seen from FIG. 2C that the portion of alias error from DC to $F_{max}$ is the same as the alias error from ($F_{sample} = F_{max}$) to $F_{sample}$. Thus, if an overall sampling rate of 2.5 $F_{max}$ were desired, the portion of 1.5 $F_{max}$ to 2.5 $F_{max}$ would be of concern and a transition bandwidth of 0.5 $F_{max}(=1.5\ F_{max}-F_{max})$ would remain in which to decrease the alias error to acceptable proportions. For a sampling rate of 2.0 $F_{max}$, a filter with zero transition bandwidth would be needed.

FIG. 3A shows the frequency response of sampled data filtered by filter 22 prior to sample rate reduction. As can be seen, the filter preferably has an equiripple amplitude pass and reject band characteristic and has a transition band extending substantially from $F_{max}$ to 1.5 $F_{max}$. While an analogue sample filter could be used without quantizer 20 within the scope of the present invention, preferably a digital filter, illustratively with finite impulse response, is used. As mentioned earlier, the present invention involves a rate reduction, and in the preferred embodiment a three to one rate reduction ratio (R) is achieved. FIG. 3B illustrates the spectrum effect of reduction in rate of three to one with the filter having a response shown in FIG. 3A. FIG. 3B includes the lobes centered at DC and 7.5 $F_{max}$, but also includes a lobe centered at 2.5 $F_{max}$ (the new sample rate) and a lobe centered at 5 $F_{max}$ (twice the new sample rate). The three to one rate reduction does not increase the alias error beyond acceptable proportions because of efficient filtering with good attenuation in the reject band.

Digital Filtering

Figure 4:
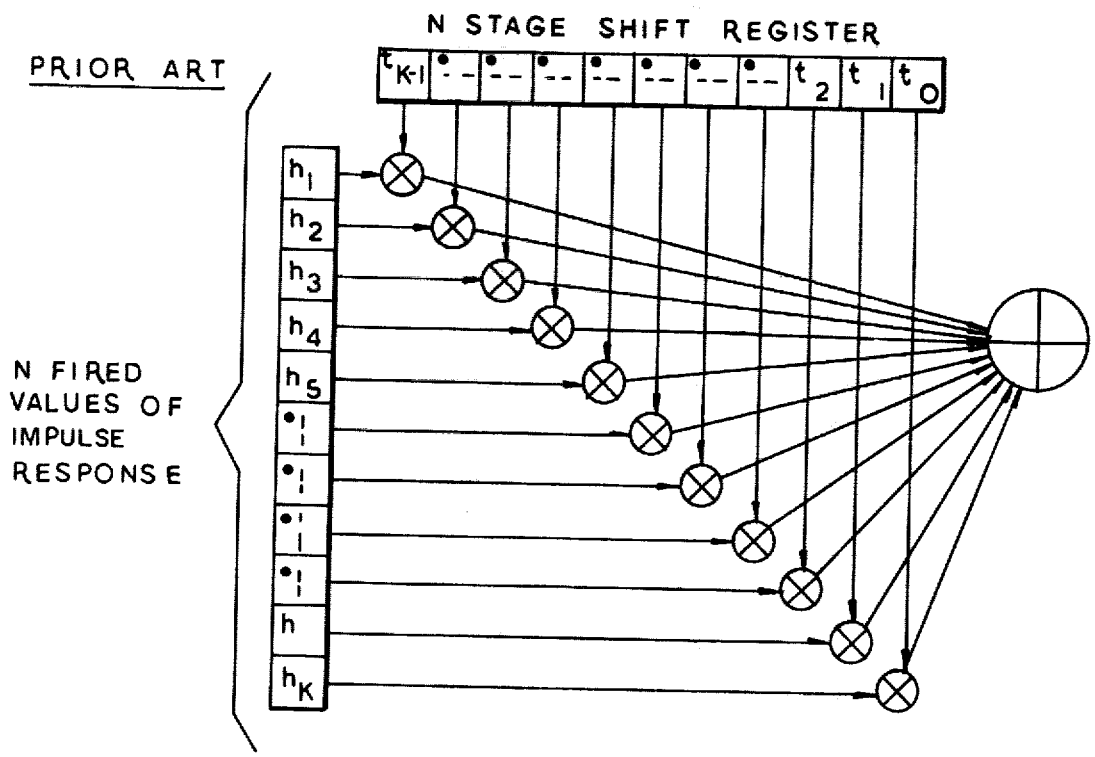
FIG. 4 is a representative diagram of a convolution calculation in a finite impulse response (FIR) discrete filter.

FIG. 4 is a basic representative diagram of a digital filter technique which may be used in practicing the present invention. It will be understood, however, that with appropriate modifications an analog filter could be used rather than a digital filter. A linear phase response and equiripple amplitude response is obtained with a finite impulse response (FIR) type discrete filter. The length of filter impulse response (K) is preselected, i.e. the number of samples to be used for each determination, each sample corresponding to a $t_i$ where i ranges from zero to $K-1$. Next, K fixed values of impulse response are determined, illustratively by computer optimization programs which design the impulse response to meet specified criteria such as cutoff frequency, transition bandwidth, and so forth. The impulse response for the filter is preferrably symmetrical to guarantee a linear phase response. FIG. 4 shows the discrete convolution of the signal time series and the impulse response, and the technique shown therein executes the following function:

$$S = \sum_{i=0}^{K-1} Z(t_i) \cdot H_{K-i}$$

Figure 5:
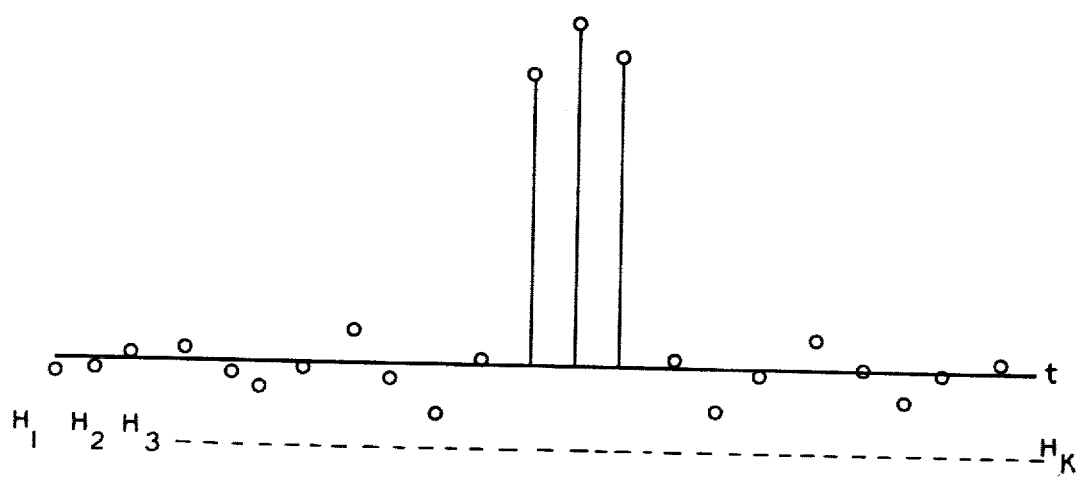
FIG. 5 is a diagram of the symmetrical impulse response of such a filter.

FIG. 5 illustrates the symmetrical impulse response of the filter represented in FIG. 4.

The Multiplier

FIG. 6A shows a simplified block diagram of a hardware implementation of the FIR discrete filter 22, not showing, however, the control, sequencing and timing circuitry. It will be understood that an appropriately programmed general purpose computer can be used. According to filter 22 a multiplier 50 multiplies data input signals $Z(t_i)$, a function of time $t_i$, with a corresponding coefficient $H_{K-i}$ inputted from a Coefficient PROM 52. A signal representing the product is applied to an adder 54 which adds the product to a partial sum stored in a Partial Summation RAM 56. At i=0, the first $Z(t_0) \cdot H_K$ product constitutes the partial sum. Since the filter operates on time division multiplexed data samples for many data channels, each data channel is allocated a portion of the Partial Summation RAM 56. Multiplier 50 receives data $Z(t_i)$ for channels 1 through N in a sequence defined by the commutation scheme used by multiplexer 18. Each time data is inputted for a particular channel, control circuitry described infra identifies a coefficient from PROM 52 and causes the adder 54 to update the running summation stored in RAM 56. After a preselected number (K) of datum for each channel are processed, a signal is outputted as shown in FIG. 6A.

Figure 6B:
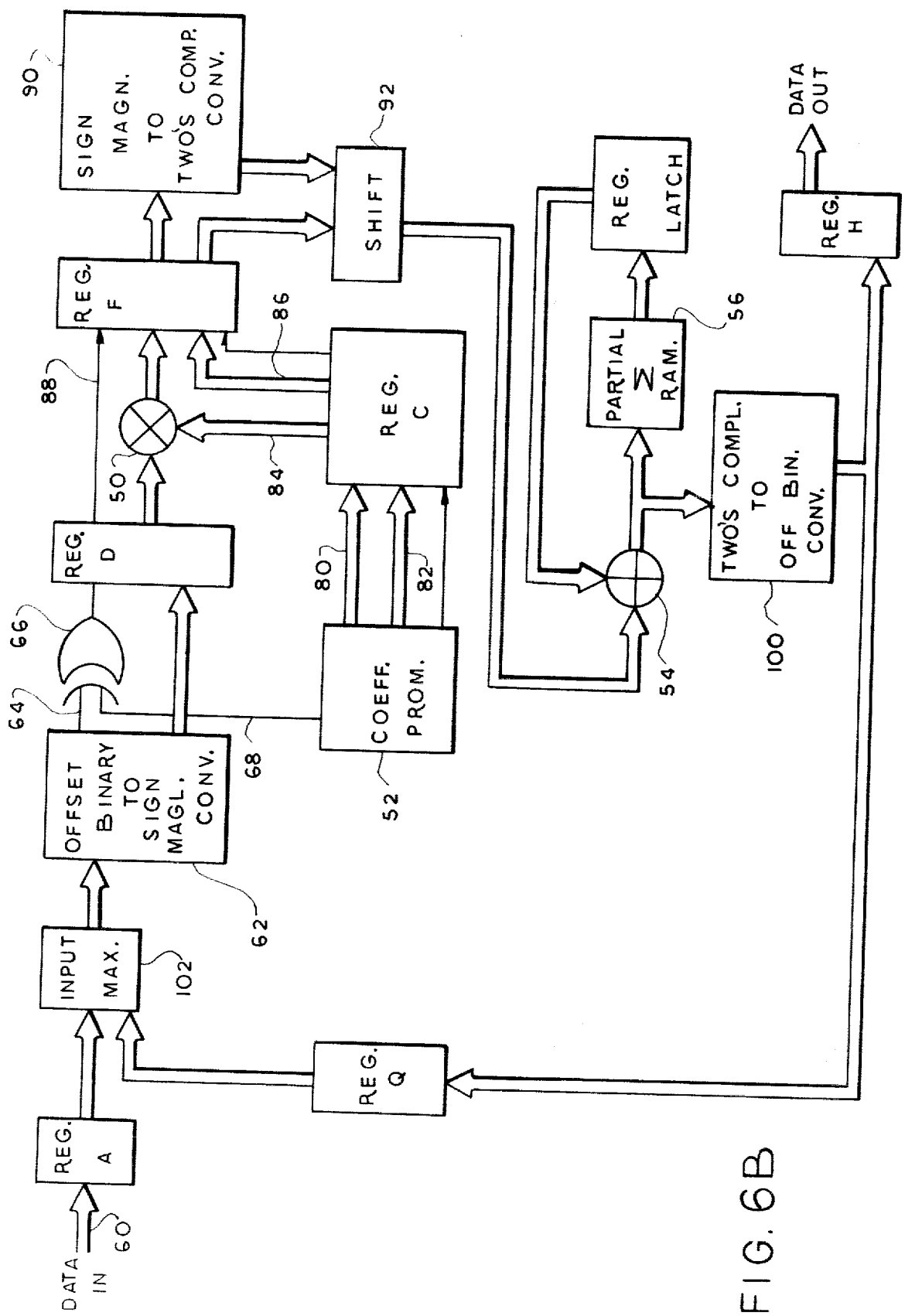

FIG. 6B is a more complete illustration of filter 22, again not showing the control, sequencing and timing circuitry. The high speed FIR discrete filter "pipelines" data. Thus, multiplexed data is inputted on a twelve line data bus 60 to Register A in twelve bits per word offset binary parallel format. The number "11" appearing in the arrowhead of data bus 60 at Register A indicates that eleven bits are applied. The twelfth bit is used for other purposes (non analog data) and will be explained infra. By pipelining, the processor can execute operations between registers so that at any time it can simultaneously execute several operations. Pipelining is considerably faster than reading data directly into processing units in serial format and serially processing each datum. In the drawing, Register A, Register D, Register C, Register F, Register G, Register H, and Register Q all are part of the pipeline operation. Each of these registers is parallel in, parallel out in operation.

Sign magnitude format is used to increase the processing speed and to decrease the data handling requirements and consequent expense of multiplier 50. Converter 62 converts Z(t) and designates one bit for the data sign and ten bits for the data magnitude. The sign information is applied by line 64 to an EXCLUSIVE OR gate 66 together with sign information of the coefficient $H_{K-i}$ applied on line 68 from PROM 52. EXCLUSIVE OR gate 66 determines the sign of the product $Z(t_{pR+i}) \cdot H_{K-i}$ which is coupled to Register D. Also applied to Register D are ten bits representing the magnitude of $Z(t_{pR+i})$.

Referring to FIG. 6B, limited floating point multiplication increases the processing speed and further lowers the hardware requirements and consequent expense of multiplier 50. It will be recalled from FIG. 5 that certain of the impulse response values H are small in comparison with other values H (such as those shown in the center of FIG. 5). Rather than relegating several of the most significant bits of the parallel word supplied by coefficient PROM 52 to zero values, which would amount to a waste of multiplier 50 time, the limited floating point arrangement dedicates eight bits to coefficient resolution (significant bits) and another set of two bits indicating the binary point position (exponent). The significant bits of $H_{K-i}$ read from PROM 52 are applied via data but 80 to Register C where they are stored according to the pipeline operation together with $H_{K-i}$ binary point position information read from PROM 52 applied to Register C via data bus 82. At appropriate times, the significant bits are applied by Register C to multiplier 50 via data bus 84, and the H binary point position information is applied to Register F via data bus 86. Multiplier 50 multiplies the eight significant bits of impulse response with a ten bit word indicating the magnitude of Z(t) input and applies the product in thirteen bit format to Register F. At appropriate times Register F combines the sign information derived from EXCLUSIVE OR gate 66 and coupled to Register F via line 88 from Register D with the magnitude information from multiplier 50 into a fourteen bit parallel word format which it applies to converter 90. Converter 90 converts the sign magnitude format to two's complement format (for efficient addition) and applies a fourteen bit word to shifter 92 which also receives at another input two bits from Register F indicating the binary point position of Z(t)·H. Shifter 92 converts from limited floating point back to fixed point format and applies a sixteen bit word to sixteen bit adder 54.

The operation of adder 54 and Partial Summation RAM 56 was described with respect to FIG. 6A. Also shown in FIG. 6B, however, is a Register G positioned intermediate RAM 56 and adder 54. Register G holds the value read from RAM 56 while RAM 56 is placed in the write mode to update the partial accumulation.

The embodiment shown in FIG. 6B includes still a further improvement over that of FIG. 6A. A scaling operation is required so that there is unity gain response in the pass band of the filter (except for the ripple feature). The peak values of H shown in FIG. 5 are scaled to obtain the maximum dynamic range of the multiplier. After all summations for an output are completed, the result is at less than unity gain through the filters. The embodiment illustrated by FIG. 6B applies that unscaled filter output through multiplier 50 for multiplication by a gain factor stored in PROM 52. Prior thereto, however, the signal is converted back into offset binary format by converter 100. The offset binary word is then stored in Register Q, part of the pipeline, and later coupled by input multiplexer 102 to converter 62. After proper scaling, output signals are outputted via Register H in twelve bit format to further equipment such as recorders 14.

The memory requirements of Partial Summation RAM 56 are not great. In the illustrated embodiment, where the length of filter impulse response is thirty one and a three to one data reduction rate is desired, eleven different impulse response coefficients must be multiplied by each data sample and therefore eleven separate RAM 56 memory locations for each analog data channel are required. Each such location must include sixteen bits to accommodate the sixteen bit word outputted by adder 54. Thus, a group of sixteen 1024×1 bit memories can accommodate ninety three channels. With forty eight 1024 bit memories, the full capability of two hundred fifty six channels can be achieved.

Sequencing Tables

TABLE 1 is an illustrative diagram which is useful in understanding the input grouping of data with their respective coefficients. Data for each of N channels is inputted sequentially to the FIR filter in some channel sequence. TABLE 1 is applicable to the groupings of data for any one channel, and it will be understood that similar groupings occur for every channel.

TABLE 1

| A | 31 | | | |
|---|---|---|---|---|
| B | 30 | | | |
| C | 29 | | | |
| D | 28 | 31 | | |
| E | 27 | 30 | | |
| F | 26 | 29 | | |
| G | 25 | 28 | 31 | |
| H | 24 | 27 | 30 | |
| I | 23 | 26 | 29 | |
| J | 22 | 25 | 28 | 31 |
| K | 21 | | 27 | 30 |

TABLE 1-continued

| L | 20 | 26 | 29 | | | | | | | |
|---|---|---|---|---|---|---|---|---|---|---|
| M | 19 | 25 | 28 | 31 | | | | | | |
| N | 18 | | | 30 | | | | | | |
| O | 17 | | | 29 | | | | | | |
| P | 16 | | | 28 | 31 | | | | | |
| Q | 15 | | | | 30 | | | | | |
| R | 14 | | | | 29 | | | | | |
| S | 13 | | | | 28 | 31 | | | | |
| T | 12 | | | | | 30 | | | | |
| U | 11 | | | | | 29 | | | | |
| V | 10 | | | | | 28 | 31 | | | |
| W | 9 | | | | | | 30 | | | |
| X | 8 | | | | | | 29 | | | |
| Y | 7 | | | | | | 28 | 31 | | |
| Z | 6 | | | | | | | 30 | | |
| AA | 5 | | | | | | | 29 | | |
| AB | 4 | | | | | | | 28 | 31 | |
| AC | 3 | | | | | | | | 30 | |
| AD | 2 | | | | | | | | 29 | |
| AE | 1 | 4 | 7 | 10 | 13 | 16 | 19 | 22 | 25 | 28 | 31 |
| AF | — | 3 | 6 | 9 | 12 | 15 | 18 | 21 | 24 | 27 | 30 |
| AG | — | 2 | 5 | | | | | | | | 29 |
| AH | — | 1 | 4 | | | | | | | | 28 | 31 |
| AI | — | | 3 | | | | | | | | | 30 |
| AJ | — | | 2 | | | | | | | | | 29 |
| AK | — | | 1 | | | | | | | | | 28 | 31 |
| AL | — | | | | | | | | | | | | 27 | 30 |
| AM | — | | | | | | | | | | | | 26 | 29 |

The leftmost column of TABLE 1 designates a sequence of successive Z(t) data input samples for one channel as A through AM. The FIR filter according to the illustrated embodiment groups thirty one input samples to form one output. Each input sample is associated with an impulse response coefficient H for a given output sample determination and the next column to the right indicates indices (addresses) of particular impulse coefficients stored in PROM 52. According to this illustrated embodiment, after thirty one inputs are processed, an output signal is generated. However, to achieve a three to one data reduction, a second group of thirty one successive data inputs, D through AH, is defined and their respective impulse coefficient indices are listed in the third column. The output signal for data D through AH is outputted three inputs after the first group of thirty one inputs. Similarly, a third group of thirty one inputs overlaps the second group but is displaced three inputs therefrom and extends from inputs G through AK. Thus, a three to one data reduction ratio is achieved by forming successive groups each displaced from adjacent groups by three data inputs, i.e. a set of sums $$\sum_{i=0}^{30} Z(i_{3p+i}) \cdot H_{31-i}$$

where $p = 0, 1, 2, 3, 4, \ldots$ where each $p$ corresponds to an output.

Input sample AE is associated with eleven impulse response coefficients, and therefore up to eleven separate memory locations in Partial Summation RAM 56 must be addressed and updated for each input sample. According to this embodiment, the number of overlaps is the next integer greater than the quotient K/R, where K is the number of samples in each filter output and R is the ratio of input rate to output rate. Thus eleven is the next integer greater than 31/3.

TABLE 2 illustrates groupings for data (after a start-up time) in any one of the N data channels with coefficient and relative partial summation address locations therefor. The leftmost column indicates thirteen different output samples and the next column to the right indicates the input sample indices for $Z(t_0)$ through $Z(t_{38})$. While thirty one coefficients H were mentioned, only sixteen different coefficient indices appear in TABLE 2 (except for G1 and G2, described later) because the response of filter 22 is preferably symmetrical. Thus, $H_{16}$ is unique, and $H_{15}=H_{17}$, $H_{14}=H_{18}$, $H_{13}=H_{19}$ ... and $H_1=H_{31}$.

Sequencing Hardware

Figure 7A:
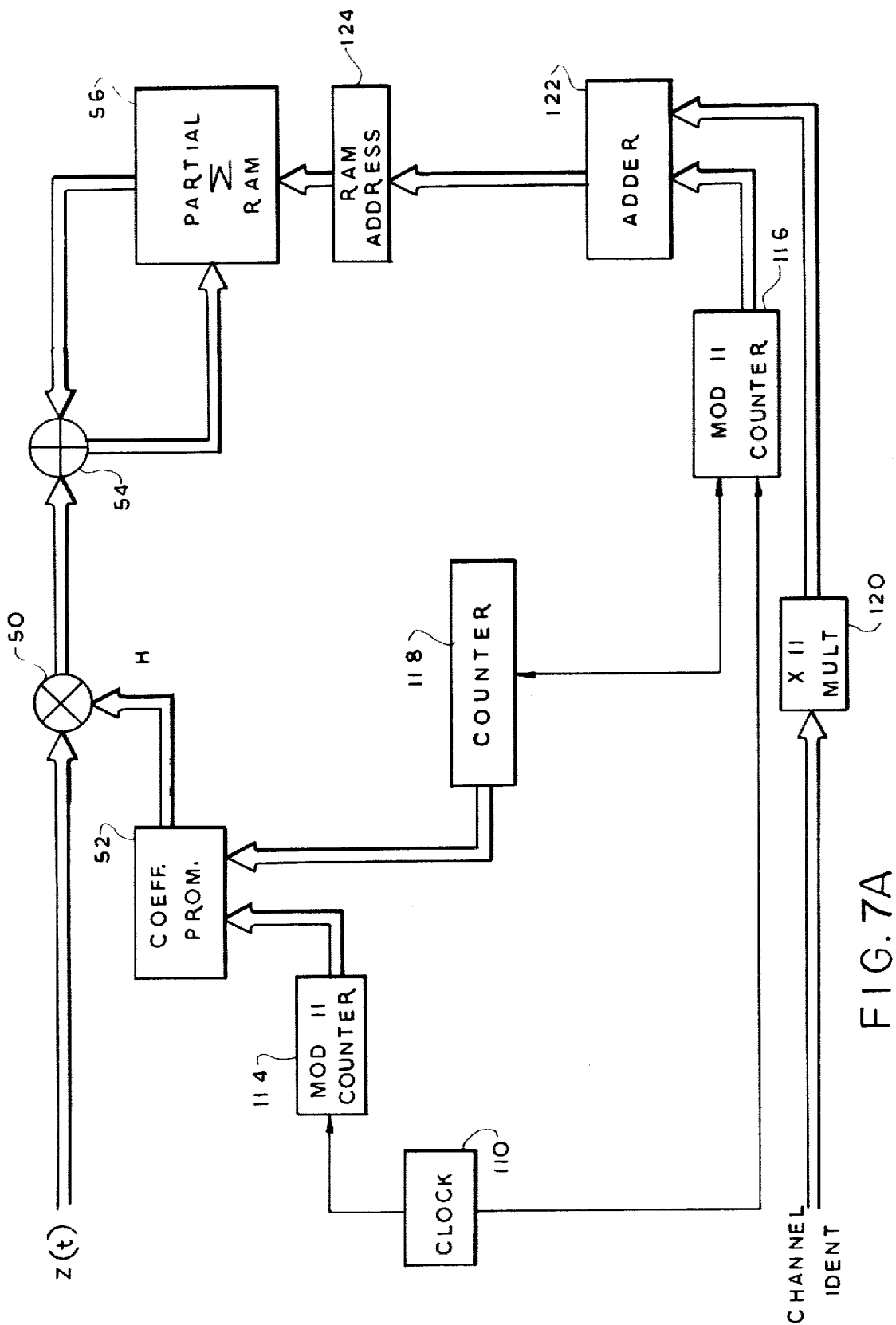
FIG. 7A is a simplified block diagram of the sequencing components.

FIG. 7A is a simplified diagram of illustrative sequencing hardware for filter 22 which directs input coefficient selection and partial sum storage. A clock 110 clocks modulo eleven counters 114 and 116. Counter 114 applies sequential counts of "one" through "eleven" to Coefficient PROM 52. A controller 118

TABLE 2

| OUTPUT SAMPLE NUMBER | INPUT SAMPLE NUMBER | PARTIAL SUMMATION RAM RELATIVE ADDRESS LOCATION | | | | | | | | | | | COEFFICIENT LINE |
|---|---|---|---|---|---|---|---|---|---|---|---|---|---|
| | | 1 | 2 | 3 | 4 | 5 | 6 | 7 | 8 | 9 | 10 | 11 | |
| | | COEFFICIENTS | | | | | | | | | | | |
| | 0 | 1 | 1 | 4 | 7 | 10 | 13 | 16 | 13 | 10 | 7 | 4 | 1 |
| | 1 | 2 | G1 | 3 | 6 | 9 | 12 | 15 | 14 | 11 | 8 | 5 | 2 |
| −9 | 2 | 3 | G2 | 2 | 5 | 8 | 11 | 14 | 15 | 12 | 9 | 6 | 3 |
| | 3 | 4 | 1 | 1 | 4 | 7 | 10 | 13 | 16 | 13 | 10 | 7 | 1 |
| | 4 | 5 | 2 | G1 | 3 | 6 | 9 | 12 | 15 | 14 | 11 | 8 | 2 |
| −8 | 5 | 6 | 3 | G2 | 2 | 5 | 8 | 11 | 14 | 15 | 12 | 9 | 3 |
| | 6 | 7 | 4 | 1 | 1 | 4 | 7 | 10 | 13 | 16 | 13 | 10 | 1 |
| | 7 | 8 | 5 | 2 | G1 | 3 | 6 | 9 | 12 | 15 | 14 | 11 | 2 |
| −7 | 8 | 9 | 6 | 3 | G2 | 2 | 5 | 8 | 11 | 14 | 15 | 12 | 3 |
| | 9 | 10 | 7 | 4 | 1 | 1 | 4 | 7 | 10 | 13 | 16 | 13 | 1 |
| | 10 | 11 | 8 | 5 | 2 | G1 | 3 | 6 | 9 | 12 | 15 | 14 | 2 |
| −6 | 11 | 12 | 9 | 6 | 3 | G2 | 2 | 5 | 8 | 11 | 14 | 15 | 3 |
| | 12 | 13 | 10 | 7 | 4 | 1 | 1 | 4 | 7 | 10 | 13 | 16 | 1 |
| | 13 | 14 | 11 | 8 | 5 | 2 | G1 | 3 | 6 | 9 | 12 | 15 | 2 |
| −5 | 14 | 15 | 12 | 9 | 6 | 3 | G2 | 2 | 5 | 8 | 11 | 14 | 3 |
| | 15 | 16 | 13 | 10 | 7 | 4 | 1 | 1 | 4 | 7 | 10 | 13 | 1 |
| | 16 | 15 | 14 | 11 | 8 | 5 | 2 | G1 | 3 | 6 | 9 | 12 | 2 |
| −4 | 17 | 14 | 15 | 12 | 9 | 6 | 3 | G2 | 2 | 5 | 8 | 11 | 3 |
| | 18 | 13 | 16 | 13 | 10 | 7 | 4 | 1 | 1 | 4 | 7 | 10 | 1 |
| | 19 | 12 | 15 | 14 | 11 | 8 | 5 | 2 | G1 | 3 | 6 | 9 | 2 |
| −3 | 20 | 11 | 14 | 15 | 12 | 9 | 6 | 3 | G2 | 2 | 5 | 8 | 3 |
| | 21 | 10 | 13 | 16 | 13 | 10 | 7 | 4 | 1 | 1 | 4 | 7 | 1 |
| | 22 | 9 | 12 | 15 | 14 | 11 | 8 | 5 | 2 | G1 | 3 | 6 | 2 |
| −2 | 23 | 8 | 11 | 14 | 15 | 12 | 9 | 6 | 3 | G2 | 2 | 5 | 3 |
| | 24 | 7 | 10 | 13 | 16 | 13 | 10 | 7 | 4 | 1 | 1 | 4 | 1 |
| | 25 | 6 | 9 | 12 | 15 | 14 | 11 | 8 | 5 | 2 | G1 | 3 | 2 |
| −1 | 26 | 5 | 8 | 11 | 14 | 15 | 12 | 9 | 6 | 3 | G2 | 2 | 3 |
| | 27 | 4 | 7 | 10 | 13 | 16 | 13 | 10 | 7 | 4 | 1 | 1 | 1 |
| | 28 | 3 | 6 | 9 | 12 | 15 | 14 | 11 | 8 | 5 | 2 | G1 | 2 |
| 0 | 29 | 2 | 5 | 8 | 11 | 14 | 15 | 12 | 9 | 6 | 3 | G2 | 3 |
| | 30 | 1 | 4 | 7 | 10 | 13 | 16 | 13 | 10 | 7 | 4 | 1 = Line | 1* |
| | 31 | G1 | 3 | 6 | 9 | 12 | 15 | 14 | 11 | 8 | 5 | 2 = Line | 2* |
| 1 | 32 | G2 | 2 | 5 | 8 | 11 | 14 | 15 | 12 | 9 | 6 | 3 = Line | 3* |
| | 33 | 1 | 1 | 4 | 7 | 10 | 13 | 16 | 13 | 10 | 7 | 4 | 1 |
| | 34 | 2 | G1 | 3 | 6 | 9 | 12 | 15 | 14 | 11 | 8 | 5 | 2 |
| 2 | 35 | 3 | G2 | 2 | 5 | 8 | 11 | 14 | 15 | 12 | 9 | 6 | 3 |
| | 36 | 4 | 1 | 1 | 4 | 7 | 10 | 13 | 16 | 13 | 10 | 7 | 1 |
| | 37 | 5 | 2 | G1 | 3 | 6 | 9 | 12 | 15 | 14 | 11 | 8 | 2 |
| 3 | 38 | 6 | 3 | G2 | 2 | 5 | 8 | 11 | 14 | 15 | 12 | 9 | 3 |

*These coefficient sequences appear in exact phase as mod counter 114 addresses them.

According to Table 2, the "coefficient" in the first column for each of inputs AF (31) and AG (32) is a gain factor G1 or G2. The first column of coefficients corresponding to inputs $Z(t_0)$ through $Z(t_{30})$ sequences from $H_1$ through $H_{16}$, then in reverse order down to $H_1$, followed by G1 and G2. Gain factors G1 and G2 are used in scaling a full accumulation, which is applied twice through multiplier 50 prior to outputting at Register H. Illustratively, G1=G2=the square root of the overall gain adjustment factor.

After applying G1 and G2 to a full accumulation, coefficient $H_1$ is applied to input $Z(t_{33})$. Thus every vertical column can be divided into similar groups each having thirty one coefficients followed by gain factors G1 and G2. Similarly, each horizontal line can be grouped into one of three different circular sequences, with varying starting points in the circular sequence. The right-most column of TABLE 2 indicates three unique sequences or "Lines" of coefficients H.

includes a modulo three counter, the count of which is applied to coefficient PROM 52 on two lines. The modulo three count identifies which of the three sequences or coefficient lines are to be read from Coefficient PROM 52, while counter 114 indexes the eleven coefficients of the selected sequence.

At the same time, the base address of eleven corresponding partial sum memory locations are generated by multiplier 120 for each channel and applied to adder 122. Counter 116 is coupled to adder 122 which combines its two inputs to sequence through each of eleven signals which are coupled by RAM address gate 124 to represent eleven address fields in RAM 56. After counter 116 sequences through its eleven locations, controller 118 increments its modulo three count by one so that with the next data sample available for the same channel, a different sequence of coefficients will be applied to multiplier 50. Controller 118 also increments counter 116 by one after each cycle of the modulo three count. It will be recalled from TABLES 1 and 2 that after three successive input samples on a given channel, the three lines of coefficients are shifted horizontally, i.e. changing the initial Partial Summation address. However, with respect to TABLE 2, shifting the coefficient indices to the right has the same effect as shifting the Partial Summation RAM address location to the left. Thus, incrementing counter 116 shifts the RAM 56 address fields for products generated for the next Z(t).

Figure 7B:
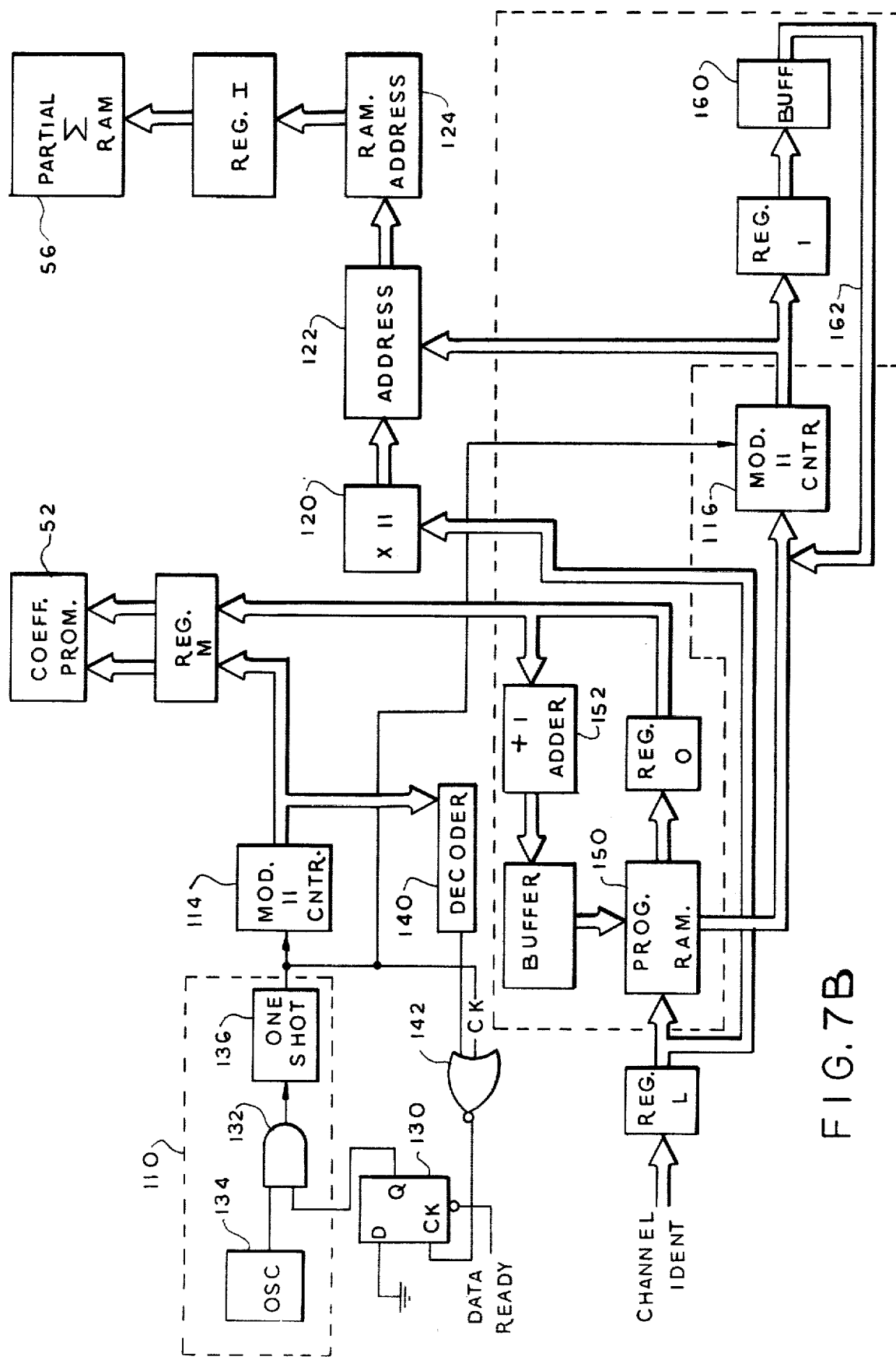
FIG. 7B is a more complete block diagram of such sequencing components of the illustrated digital filter.

FIG. 7B shows a more complete illustrative version of the timing and sequencing portion of filter 22. When data is incoming, a signal appears on the DATA READY line coupled to flip flop 130, the Q output of which enables AND gate 132. Gate 132 receives as its other input 6.6 megahertz signals provided by oscillator 134 and, when enabled, activates one shot multivibrator 136 which provides clock signals each of 100 nanosecond duration. Oscillator 134, gate 132 and multivibrator 136 constitute clock 110 in FIG. 7A. The clock signals are applied to modulo eleven counter 114 which sequences through eleven counts applied to Register M. After eleven counts, decoder 140 enables EXCLUSIVE OR gate 142 which clocks flip flop 130, thereby grounding the Q output and disabling clock 110. Filter/processor 22 remains in this mode until the next data sample Z(t) is ready as indicated on the DATA READY line.

While modulo eleven counter 114 sequences through the eleven coefficients of the three different sets, Program RAM 150 determines which of the three coefficient sequences are used. The channel identified on CHANNEL IDENTIFICATION lines is coupled to Program RAM 150 by Register L. RAM 150 includes sufficient memory to associate the identified channel with a modulo three count indicating to Register M which of the three sequences is to be used. After each data sample is processed, adder 152, via buffer 154, increments the modulo three count stored in Program RAM 150 by one so that the next input sample for the same channel will be sequenced through the proper line of coefficients.

In similar fashion, Program RAM 150 directs the starting count of modulo eleven counter 116. It applies its eleven count sequence in four bit parallel format to adder 122 which in combination with multiplier 120 indexes eleven locations in Partial Summation RAM 56. Register J in combination with buffer 160 provides the starting count of counter 116 incremented by one via data bus 162. The incremented modulo eleven count is stored in program RAM 150 in association with its respective channel identification index so that after three input samples for that particular channel the Partial Summation RAM 56 addresses will be shifted properly as set forth earlier.

Scaling and Outputting

TABLE 2 shows that an application of gain factors G1 and G2 occurs when filter 22 is sequencing the first element of each of the second and third line of coefficients. This sequencing is implemented by apparatus shown in FIG. 8 which includes a modulo three counter 192 clocked at the input sample rate and which counts mod three in binary, that is, "00, 01, 10, 00, 01 . . ." These counts correspond to the three different lines of coefficient indices underscored in TABLE 2. From counter 192 three outputs are provided: 00 mod 3, LSB mod 3, and MSB mod 3. The 00 mod 3 output is positive only at a "00" count. The LSB mod 3 output tests for presence of the least significant bit and is thus positive only at "01". The MSB mod 3 output tests for presence of the most significant bit and is thus positive only at "10".

Accumulations from adder 54, converted to offset binary by converter 100, are coupled via Register Q to Input Multiplexer 102. By gates 196 and 198, Register Q is enabled at the trailing edge of the fourth count of modulo eleven counter 114 (which counts through eleven coefficient indices) when mod 3 counter 192 is in its first and second positions ("00" and "01"). The MSB mod three is applied to OR gate 196, the other input being "/#4", that is, positive logic signals (binary "1") when mod eleven counter 114 is at all counts except "4" and negative (binary "0") signals at a count of "4". Thus, the output of OR gate 196 is a binary "0" only when counter 114 is on count "4" and counter 192 in the first or second count. The output of gate 196 is coupled to one input of OR gate 198, the other input of which is coupled to the system clock. Gate 198 enables Register Q whenever clock signals pass through the gate. However, only when the output of gate 196 is "0" are the clock pulses recognized, i.e. This occurs at the count of "4" of counter 114 when counter 192 is at its first or second counts. Thus, Register Q is loaded with the complete summation value when counter 192 is at its first count and again loaded with the complete summation after scaling by G1 when counter 192 is at its second count.

The channel passed by Input Multiplexer 102 is controlled by OR gate 202 and flip-flop 204, according to which Input Multiplexer 102 switches at count "2" of counter 114 during the second and third counts of counter 192. The mod three counter 192 "00" count is applied as one input of OR gate 202, so gate 202 will output a binary "1" whenever counter 192 is in its first state, i.e., during "Line 1" coefficients. A second input to OR gate 202 is "/#1" (not count "1") of counter 114. The "/#1" signal is positive at all counts except "1" and is a binary "0" at count "1" of counter 114. Proceeding sequentially through "Line 1," "Line 2," and "Line 3" coefficient indices shown in TABLE 2, then, the output of gate 202 is positive through "Line 1," zero at G1, then positive through the rest of "Line 2," zero at G2, and then positive through the rest of "Line 3." Hence, on the next clock pulse after each of the G1 and G2 coefficients, flip-flop 198 changes state and switches Input Multiplexer 102 (corresponding to count "2" of counter 114), thus applying the accumulation from Register Q to Register D. On count "3" the accumulation is applied to multiplier 50.

Correspondingly, on count "1" the address of scaling coefficient G1 or G2 is applied to Register M. On count "2" the selected scaling factor is applied by PROM 52 to Register C, and on count "3" the scaling factor is applied to the multiplier 50. Thus the accumulated sum is applied to multiplier 50 together with the corresponding scaling factor. On count "4" the product is clocked through Register F, converter 90, shifter 92, adder 54 and converter 100 and available to Register Q for further scaling or to the processor output.

Figure 9:
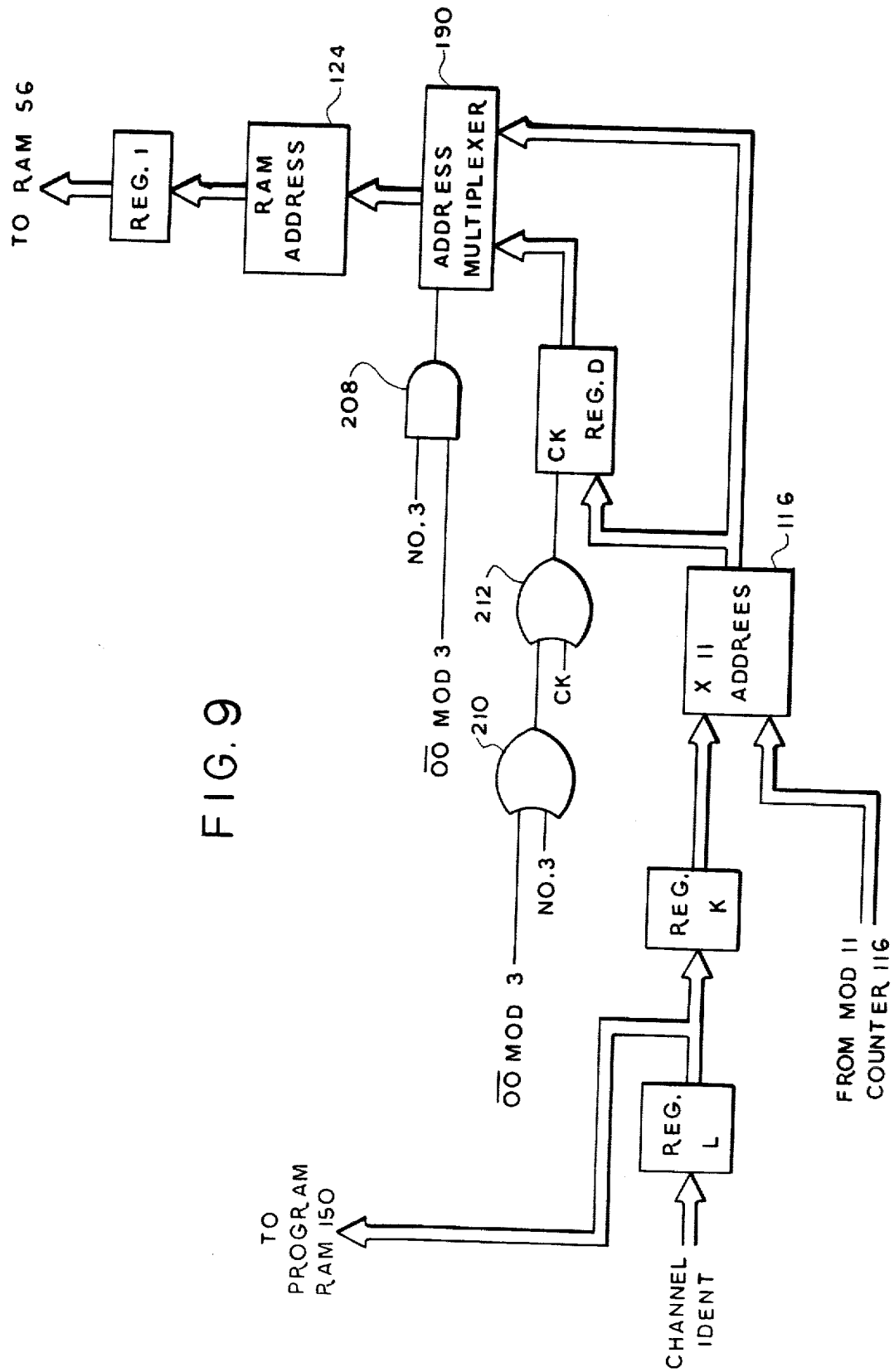
FIG. 9 is another block diagram relating to scaling the filtered sample in the illustrated filter.

Referring to FIG. 9, two address channels are inputted to Address Multiplexer 190 for PARTIAL SUMMATION RAM 56. Twelve signals are applied to one input of Address Multiplexer 190 by multiplier/adder 186. Register P provides the other input which is an address used when scaling factor G1 or G2 is sequenced. After any accumulation is ready for scaling, its address is clocked into Register P by NOR gates 210 and 212, and when the next G1 or G2 is sequenced (regardless of the particular channel), the address of such accumulation is applied from Register P when Address Multiplexer 190 switches inputs. As a result, an accumulation need not wait for its own channel to be identified, and can be outputted earlier. Further, the memory requirements of Register Q are reduced, which otherwise would have to store accumulations for all but one channel.

Address Multiplexer 190 is responsively coupled to AND gate 208, one input of which is a counter 192 "not 00 mod 3" count, the other input of which is count "3" of counter 114 identified by decoder 140 (FIG. 7B). Thus, on count "3" of counter 114, during Line 2 and Line 3 coefficients, Address Multiplexer 190 is switched to couple Register P to RAM Address 124. It will be recalled that gates 202 and 204 switch Input Multiplexer 102 at count "2" and that a scaled output is applied to adder 54 at count "4". Correspondingly, Address Multiplexer 190 is switched at count "3" but after sequencing through Register I the proper RAM address occurs also on count "4".

Referring to FIG. 10, after scaling the output sample is strobed out of the system by Register H which is clocked by gates 220 and 222 at the end of count "4" of counter 114. OR gate 222 blocks the inputted clock signal from strobing Register H whenever its other input is positive. Count "4" of counter 114 is coupled by decoder 140 to one input of NAND gate 220. The other input is the MSB signal from modulo three counter 192 (FIG. 8). Thus, the NAND output is negative only during count "4" of the modulo eleven count and during state three of counter 192. Gate 222 thereby clocks Register H at the end of every third count of "4" of counter 114.

Digital Sample Data

Often acquired data is inherently digital and need not be filtered. The illustrative embodiment of filter 22 therefore distinguishes between analog sample and digital sample data. When digital sample data is inputted, it is coupled by Register B (FIG. 10) to Output Multiplexer 250. Further, means are provided to prevent Program RAM 150 from incrementing the modulo three or modulo eleven counts and Partial Summation RAM 56 from receiving updated accumulation, by appropriately inhibiting the write inputs thereof. Specifically when digital sample data is inputted, as signalled on the DIGITAL STROBE input, flip flop 260 is reset. Flip flop 260 is coupled to Register B by AND gate 262. Output Multiplexer 250 is responsively coupled by flip flop 268 to AND gate 262 so that when digital sample data is indicated by the Digital Strobe input, Output Multiplexer 250 throughputs digital sample data to Register H. Disabling Circuit 270 cooperates with flip flop 260 disabling the write modes of RAMs 56 and 150 when digital data is inputted.

A Second Embodiment

The previously illustrated and described embodiment uses thirty one inputs to form one output, and by overlapping computations, outputs a signal at a rate of one-third of the input rate. If faster operation is desired, the length of filter impulse response can be reduced (fewer samples per output can be used). In a second embodiment (not shown) samples of twenty five inputs are used to form one output. Counters 114 and 116 are modulo nine counters, (since K/N=25/3=8.66 and nine is the next greatest integer). The other consequent change would allow multiplier/adder 186 to multiply by nine rather than eleven. TABLE 3 shows the correlations between input samples of a single channel, coefficient index numbers, RAM 56 storage indices, (corresponding to counter 116), coefficient line number (corresponding to the position of modulo three counter 192) and output index numbers.

TABLE 3

| OUTPUT SAMPLE NUMBER | INPUT SAMPLE NUMBER | PARTIAL SUMMATION RAM RELATIVE ADDRESS LOCATION | | | | | | | | | COEFFICIENT LINE |
|---|---|---|---|---|---|---|---|---|---|---|---|
| | | 1 | 2 | 3 | 4 | 5 | 6 | 7 | 8 | 9 | |
| | | COEFFICIENTS | | | | | | | | | |
| | 0 | 1 | 1 | 4 | 7 | 10 | 13 | 10 | 7 | 4 | 1 |
| | 1 | 2 | G1 | 3 | 6 | 9 | 12 | 11 | 8 | 5 | 2 |
| −7 | 2 | 3 | G2 | 2 | 5 | 8 | 11 | 12 | 9 | 6 | 3 |
| | 3 | 4 | 1 | 1 | 4 | 7 | 10 | 13 | 10 | 7 | 1 |
| | 4 | 5 | 2 | G1 | 3 | 6 | 9 | 12 | 11 | 8 | 2 |
| −6 | 5 | 6 | 3 | G2 | 2 | 5 | 8 | 11 | 12 | 9 | 3 |
| | 6 | 7 | 4 | 1 | 1 | 4 | 7 | 10 | 13 | 10 | 1 |
| | 7 | 8 | 5 | 2 | G1 | 3 | 6 | 9 | 12 | 11 | 2 |
| −5 | 8 | 9 | 6 | 3 | G2 | 2 | 5 | 8 | 11 | 12 | 3 |
| | 9 | 10 | 7 | 4 | 1 | 1 | 4 | 7 | 10 | 13 | 1 |
| | 10 | 11 | 8 | 5 | 2 | G1 | 3 | 6 | 9 | 12 | 2 |
| −4 | 11 | 12 | 9 | 6 | 3 | G2 | 2 | 5 | 8 | 11 | 3 |
| | 12 | 13 | 10 | 7 | 4 | 1 | 1 | 4 | 7 | 10 | 1 |
| | 13 | 12 | 11 | 8 | 5 | 2 | G1 | 3 | 6 | 9 | 2 |
| −3 | 14 | 11 | 12 | 9 | 6 | 3 | G2 | 2 | 5 | 8 | 3 |
| | 15 | 10 | 13 | 10 | 7 | 4 | 1 | 1 | 4 | 7 | 1 |
| | 16 | 9 | 12 | 11 | 8 | 5 | 2 | G1 | 3 | 6 | 2 |
| −2 | 17 | 8 | 11 | 12 | 9 | 6 | 3 | G2 | 2 | 5 | 3 |
| | 18 | 7 | 10 | 13 | 10 | 7 | 4 | 1 | 1 | 4 | 1 |
| | 19 | 6 | 9 | 12 | 11 | 8 | 5 | 2 | G1 | 3 | 2 |
| −1 | 20 | 5 | 8 | 11 | 12 | 9 | 6 | 3 | G2 | 2 | 3 |
| | 21 | 4 | 7 | 10 | 13 | 10 | 7 | 4 | 1 | 1 | 1 |
| | 22 | 3 | 6 | 9 | 12 | 11 | 8 | 5 | 2 | G1 | 2 |
| 0 | 23 | 2 | 5 | 8 | 11 | 12 | 9 | 6 | 3 | G2 | 3 |
| | 24 | 1 | 4 | 7 | 10 | 13 | 10 | 7 | 4 | 1 = Line | 1* |
| | 25 | G1 | 3 | 6 | 9 | 12 | 11 | 8 | 5 | 2 = Line | 2* |
| 1 | 26 | G2 | 2 | 5 | 8 | 11 | 12 | 9 | 6 | 3 = Line | 3* |
| | 27 | 1 | 1 | 4 | 7 | 10 | 13 | 10 | 7 | 4 | 1 |
| | 28 | 2 | G1 | 3 | 6 | 9 | 12 | 11 | 8 | 5 | 2 |

TABLE 3-continued

| OUTPUT SAMPLE NUMBER | INPUT SAMPLE NUMBER | PARTIAL SUMMATION RAM RELATIVE ADDRESS LOCATION | | | | | | | | | COEFFICIENT LINE |
|---|---|---|---|---|---|---|---|---|---|---|---|
| | | 1 | 2 | 3 | 4 | 5 | 6 | 7 | 8 | 9 | |
| 2 | 29 | 3 | G2 | 2 | 5 | 8 | 11 | 12 | 9 | 6 | 3 |

*These coefficient sequences appear in the exact phase as the modulo eleven counter 114 addresses them Those skilled in the art will appreciate that various modifications can be made to the illustrative embodiments described herein within scope of the present invention.

I claim:

1. An improved data acquisition system of the type having a plurality of input circuits for receiving data, an output circuit supplying acquired data to other equipment for processing, recording or other data handling, and means coupled to said input circuits for sampling said data prior to delivering the data samples to said output circuit at a sample rate, wherein the improvement comprises a filter coupling said sampling means to said output circuit, said filter reducing the sample rate of the system and including:
   an input circuit applying each data input sample $Z(t_i)$ to a multiplier;
   a coefficient memory device coupled to said multiplier and storing a plurality of impulse response coefficients H;
   a first modulo counter coupled to said coefficient memory device for sequencing through selected ones of said coefficients corresponding to a particular $Z(t_i)$ and sequentially indexing and applying said coefficients to said multiplier for multiplication with said input sample;
   a memory and adder arrangement coupled to said multiplier for storing signals representing the set of summations $$\sum_{i=0}^{k-1} Z(t_{pR+i}) \cdot H_{K-i}$$

where P is a sequence of integers, R and K are integers, and i is a sequence of consecutive integers, said memory and adder arrangement including a second modulo counter indexing different memory fields at the same rate that said coefficients are indexed for each data sample; and
   a filter output coupled to said memory and adder arrangement and outputting a filtered sample for each group of a predetermined number of input samples $Z(t_i)$.

2. The system according to claim 1 further comprising a control circuit coupled to said coefficient memory device, said control circuit generating signals to index one of a plurality of coefficient sequences stored in said coefficient memory device, said first modulo counter indexing through each coefficient of said control circuit-selected sequence.

3. The system according to claim 2 wherein the modulus of said first counter is the next integer greater than K/R where K is the number of input samples per desired output sample and R is the ratio of the data input sample rate to the desired output sample rate.

4. The system according to claim 3 wherein said control circuit is coupled to and increments said second modulo counter after all respective coefficients are sequenced for a corresponding inputted data sample.

5. The system according to claim 3 or 4 wherein said control circuit is coupled to and increments said first counter after all respective coefficients are applied to said multiplier for sequential multiplication thereof with a corresponding input $Z(t_i)$.

6. The data acquisition system of claim 1 wherein said filter includes a cutoff frequency of the maximum frequency of interest $F_{max}$ and a transition band from the maximum frequency of pass band to the minimum frequency of reject band being in width substantially less than or equal to $(D-2) F_{max}$ where D is the ratio of the desired output sample rate to $F_{max}$.

7. The system of claims 1 wherein $R=3$.

8. The system of claims 1 or 6, wherein the filter has an equiripple amplitude pass and reject band characteristic.

9. A machine implemented method of sampling data having a maximum frequency of interest $F_{max}$ comprising:
   gathering data from a plurality of channels;
   sampling the gathered data at a first rate exceeding $F_{max}$; and
   filtering the sampled data by combining selected groups of said sampled data to provide filtered output samples at a second rate slower than said first rate wherein said filtering includes applying a selected respective coefficient $H_{k-i}$ to successive respective sampled data $Z(t_i)$ to generate the product thereof, and computing a set of M overlapping in time summations:

$$\sum_{i=0}^{i=K-1} Z(t_{i+PR}) \cdot H_{K-i}$$

where K is the number of input samples for each output of the filtering, R is the ratio of said first rate to said second rate, M is the next integer greater than K/R, and P is a sequence of up to M successive integers starting from O.

10. The method of claim 9 wherein said forming overlapping summations comprises, for each data sample on the same channel:
   selecting a sequence of up to M coefficients H,
   forming the products of $Z(t_i)$ and each selected coefficient H, and
   adding each such product to a corresponding accumulation stored in a memory device.

11. The method of claim 10 wherein said selecting a sequence includes
   incrementing a counter to index a sequence of coefficients,
   counting through up to M elements of the sequence, and
   indexing through up to M memory locations in which to store said products.

12. The method of claim 11 further including incrementing said index of memory locations by one after processing each $Z(t_i)$.

13. A data acquisition system comprising:

a time division multiplexer for receiving data from a plurality of input channels, sampling each of said channels, and providing commutated data samples at a first rate; and a digital filter coupled to said multiplexer and including means for receiving said commutated data samples and processing groups of data samples for each channel to provide output samples at a second rate lower than said first rate, wherein said filter is a discrete finite impulse response filter and having a pass band, a reject band and a transition band therebetween, said reject band attenuating signals, otherwise causing alias error if data were sampled at said second rate, said transition band being in a bandwidth of $(D-2) F_{max}$, where $F_{max}$ is the minimum frequency of interest of said data, and $D \cdot F_{max}$ equals said second rate, said filter comprising:

(A) an input circuit receiving successive data samples $Z(t)$ from said multiplexer;

(B) a multiplier coupled to said input circuit and receiving said data samples $Z(t)$;

(C) a first memory device coupled to said multiplier and storing a plurality of impulse response coefficients $H_l$ through $H_k$, where k is the length of filter impulse response;

(D) a clock providing clock pulses;

(E) means coupled to said first memory device for sequencing through M selected coefficients for each input sample $Z(t)$ applied to said filter, where M is the next integer greater than K/R, where R is an integer equal to the ratio of said first rate to said second rate, said sequencing means including:

(i) a modulo M counting device responsive to clock pulses and coupled to said first memory device and counting through each of M positions for each input data sample $Z(t)$, said M positions indexing through a sequence of M coefficients H; and (ii) a modulo R counting device coupled to said first memory device and responsive to successive input data information for a particular channel, wherein the count of said number R counter indexes one of R sequences of coefficients H, whereby for each inputted data sample $Z(t)$ a sequence of M products $Z(t) \cdot H_j$ is formed;

(F) an accumulator arrangement including:

(i) an adder coupled at one input to said multiplier output; and (ii) a second memory device supplying stored partial accumulation signals to a second input of said adder, and receiving and storing the M outputs of said adder for each data sample $Z(t)$;

(G) means coupled to said second memory device for sequencing through M second memory device locations in said second memory device concurrently with said sequencing through M selected coefficients by said sequencing means coupled to said first memory device, said M sequenced second memory device locations being accessed thereby for read/write operations by said accumulator arrangement whereby up to M partial accumulations representing $\Sigma Z(tA_0+i) \cdot H_{K-i}, \Sigma Z(tA_1+i) \cdot H_{K-i},$
$\Sigma Z(tA_2+i) \cdot H_{K-i}, \ldots$ are formed, where $A_0, A_1, A_2, \ldots$ are integers; and (H) output means for outputting said accumulated signal after summing $Z(t_i) \cdot H_{K-i}$ for K successive input successive sample $Z(t)$.

14. The system of claim 13 further including channel identifying input means and including a program memory device coupled to said channel identification means and constituting said modulo R counting device, said program memory device storing modulo R counts each corresponding to a respective one of the commutated channels and incrementing the respective modulo R count by one with each successive data sample inputted for the corresponding channel.

15. The system of claim 14 wherein said program memory device is coupled to said means for sequencing said second memory and increments said memory location sequence for each channel by one with each successive data sample inputted for the corresponding channel.

16. The system of claim 13 wherein $A_0, A_1, A_2 \ldots$ is a sequence of integers defined by $A_p=(P)(R), p=0, 1, 2, 3, \ldots$.

17. The system of claim 13 wherein said first memory device further stores a scaling factor, and further comprising means for applying an accumulated sum after K multiplications to said multiplier and providing said scaling factor to said multiplier for multiplication with said accumulated sum prior to outputting by said output means.

18. The system according to claim 13 further comprising means coupled to an output of said first memory device indicating the order of magnitude of each coefficient applied to said multiplier.

19. The system according to claim 13 further including means for routing data, applied to said filter but not for processing, to an output and for disabling the writing of new data into said memory devices.

* * * * *